(12) United States Patent
Wu (10) Patent No.: US 12,327,588 B2
(45) Date of Patent: *Jun. 10, 2025

(54) STRESSING ALGORITHM FOR SOLVING CELL-TO-CELL VARIATIONS IN PHASE CHANGE MEMORY

(71) Applicant: Taiwan Semiconductor Manufacturing Co., Ltd., Hsinchu (TW)

(72) Inventor: Jau-Yi Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,733

(22) Filed: Nov. 21, 2023

(65) Prior Publication Data

US 2024/0087645 A1   Mar. 14, 2024

Related U.S. Application Data

(63) Continuation of application No. 17/885,462, filed on Aug. 10, 2022, now Pat. No. 11,862,244, which is a continuation of application No. 16/837,770, filed on Apr. 1, 2020, now Pat. No. 11,475,950.

(51) Int. Cl.
  *G11C 13/00* (2006.01)
  *G11C 29/08* (2006.01)
  *H10B 63/00* (2023.01)

(52) U.S. Cl.
  CPC ...... *G11C 13/0069* (2013.01); *G11C 13/0004* (2013.01); *G11C 29/08* (2013.01); *G11C 2013/0078* (2013.01); *H10B 63/30* (2023.02)

(58) Field of Classification Search
  CPC . G11C 13/0069; G11C 13/0004; G11C 29/08; G11C 29/50; G11C 29/06; G11C 13/0097
  See application file for complete search history.

(56) References Cited

U.S. PATENT DOCUMENTS

| 9,373,382 B1 | 6/2016 | Wu et al. |
| 2006/0220688 A1 | 10/2006 | Hsu et al. |
| 2009/0086531 A1* | 4/2009 | Yang ............ G11C 29/06 365/158 |
| 2009/0175071 A1* | 7/2009 | Lee ............... G11C 29/50008 365/201 |
| 2014/0325120 A1 | 10/2014 | Park et al. |
| 2016/0225446 A1 | 8/2016 | Khwa et al. |

OTHER PUBLICATIONS

Navarro et al., Investigation of the electrical performances of utrench PCM at high operating temperature, IEEE, pp. 1 to 4. (Year: 2012).*

Castellani et al., Comparative analysis of program/read disturb robustness for GeSbTe-based phase-change memory devices, IEEE, pp. 1 to 4. (Year: 2016).*

* cited by examiner

*Primary Examiner* — Shelly A Chase
(74) *Attorney, Agent, or Firm* — Seed IP Law Group (57) ABSTRACT

A process is provided to trim PCRAM cells to have consistent programming curves. Initial programming curves of PCRAM cells are measured. A target programming curve is set up for the PCRAM cells. Each PCRAM cell is then modulated individually to meet the target programming curve.

20 Claims, 6 Drawing Sheets

STRESSING ALGORITHM FOR SOLVING CELL-TO-CELL VARIATIONS IN PHASE CHANGE MEMORY

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1000 and thus the phase change memory devices are unlikely to have erroneous reading. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PCRAM).

PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells.

Phase change material is formed between top electrode and bottom electrode contact. In a reset operation, phase change material may be heated up to a temperature higher than the melting temperature when a current passes through it. The temperature is then quickly dropped below the crystallization temperature. A portion of the phase change material is changed to an amorphous state with a high resistivity, thus the state of the PCRAM cell is changed to a high-resistance state. Region can be set back to the crystalline state by heating up the phase change material to a temperature higher than the crystallization temperature, but below the melting temperature, for a certain period.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
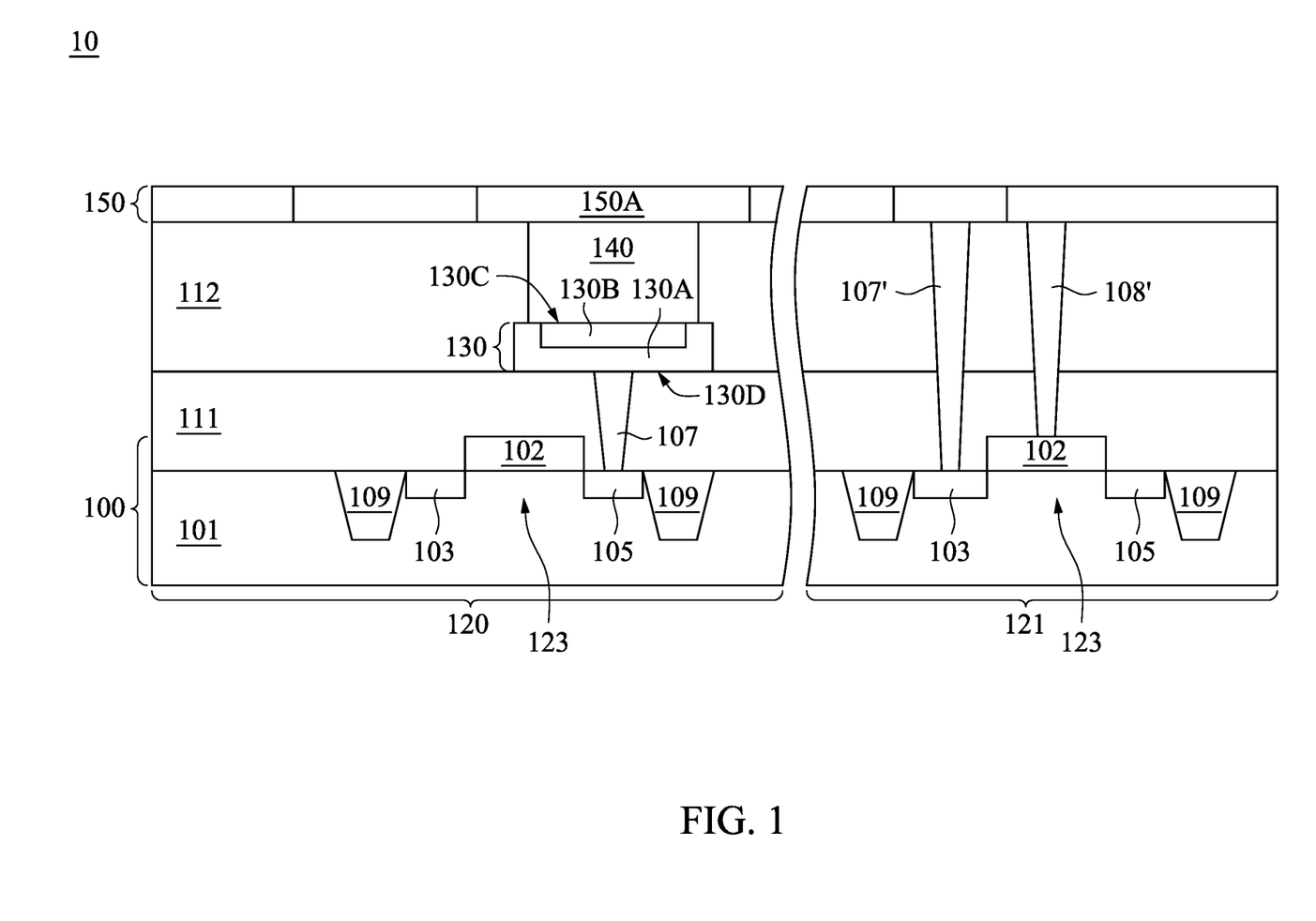
FIG. 1 illustrates an example PCRAM cell according to embodiments of the disclosure.

FIG. 1 is a cross sectional view showing a semiconductor structure 10, in accordance with some embodiments of the present disclosure. Referring to FIG. 1, the semiconductor structure 10 includes a semiconductor chip having a memory region 120 and a peripheral region 121. In some embodiments, the memory region 120 is close to a chip center than the peripheral region 121. The memory region 120 includes a transistor region 100, a heater 130 over the transistor region 100, and a phase change layer 140 over the heater 130. In some embodiments, the semiconductor structure 10 is a PCRAM device.

In some embodiments, the transistor region 100 includes a substrate 101, a source 103, a drain 105, a STI structure 109 in the substrate, a gate 102, and a contact plug 107 in an inter-layer dielectric (ILD) 111 immediately over the substrate 101. In some embodiments, the substrate 101 may include an epitaxial layer formed on the active side, such as an epitaxial semiconductor layer overlying a bulk semiconductor wafer. In some embodiments, the substrate 101 includes a semiconductor-on-insulator (SOI) structure. For example, the substrate may include a buried oxide (BOX) layer formed by a process such as separation by implanted oxygen (SIMOX). In various embodiments, the substrate 101 includes various p-type doped regions and/or n-type doped regions, such as p-type wells, n-type wells, p-type source/drain features and/or n-type source/drain features, formed by a process such as ion implantation and/or diffusion. The substrate 101 may include other functional features such as a resistor, a capacitor, diode, transistors, such as field effect transistors (FETs). The substrate 101 may include lateral insulation features configured to separate various devices formed on the substrate 101. The substrate 101 may further include a portion of a multilayer interconnection (MLI) structure. The multilayer interconnection structure includes metal lines in a plurality of metal layers. The metal lines in different metal layers may be connected through vertical conductive features, which are referred to as via features. The multilayer interconnection structure further includes contacts configured to connect metal lines to gate electrodes and/or doped features on the substrate 101. The multilayer interconnection structure is designed to couple various devices features (such as various p-type and n-type doped regions, gate electrodes and/or passive devices) to form a functional circuit.

In some embodiments, the transistor region 100 includes heavily doped regions such as a source 103 and a drain 105 at least partially in the semiconductor substrate 101. A gate 102 is positioned over a top surface of the semiconductor substrate 101 and between the source 103 and the drain 105 to jointly form a transistor structure 123. FIG. 1 shows planar transistors having a doped region in the semiconductor substrate 101. However, the present disclosure is not limited thereto. Any non-planar transistor, such as a FinFET structure, can have raised doped regions. Contact plugs 107 may be formed in a bottom inter-layer dielectric (ILD) 111 adjoined to the top surface of the semiconductor substrate 101, and may be electrically coupled to the transistor region 100. The bottom ILD 111 above the semiconductor substrate 101 may be formed from a variety of dielectric materials and may, for example, be an oxide (e.g., Ge oxide), an oxynitride (e.g., GaP oxynitride), silicon dioxide (SiO2), a nitrogen-bearing oxide (e.g., nitrogen-bearing SiO2), a nitrogen-doped oxide (e.g., N2-implanted SiO2), silicon oxynitride (SixOyNz), and the like.

In many instances, shallow trench insulation (STI) structures 109 are provided to define and electrically isolate adjacent transistors. The STI structures 109 are formed in the semiconductor substrate 101.

In many instances, a phase change random access memory (PCRAM) structure, including at least a phase change material, a bottom electrode and a top electrode, is embedded in the metallization layer prepared in a back-end-of-line (BEOL) operation, whereas the transistor region 100 is prepared in a front-end-of-line (FEOL) operation. The PCRAM structure may be embedded in any position of the metallization layer over the transistor region 100, for example, between adjacent metal layers or any of the two metal layers distributed horizontally parallel to a surface of the semiconductor substrate 101. Throughout the description, the term "metal layer" refers to the collection of the metal lines in the same layer. On the other hand, the embedded PCRAM structure can be located between the contact plug 107 and the first metal layer 150. The number provided for the metal layer herein is not limiting. In general, people having ordinary skill in the art can understand that the PCRAM can be located between an Nth metal layer and an (N+1)th metal layer, or between an Nth metal layer and an (N+2)th metal layer, or between an Nth metal layer and an (N+M)th metal layer, where N and M are integers greater than or equal to 1. In an embodiment, the Nth metal layer includes metal lines surrounded by dielectric layer. Metal lines may be formed using well-known single damascene process, and may be formed of copper or copper alloys such as AlCu, although other metallic material may also be used.

In some embodiments, as shown in FIG. 1, the heater 130 functions as a bottom electrode to the phase change layer 140, and the metal line 150A of the first metal layer 150 functions as a top electrode of the phase change layer 140. In some embodiments, the heater 130 or the bottom electrode is in contact with the contact plug 107 for accessing source 103 or drain 105. The contact plug 107 is surrounded by the bottom ILD 111, and a bottom of the heater 130 or the bottom electrode is in contact with the bottom ILD 111. The formation of contact plug 107 may include forming openings in bottom ILD 111, filling the openings, and then performing a chemical mechanical polish (CMP). Gate contact plug electrically connects gate 102 from overlying metal lines and vias (not shown). For simplicity, the gate contact plug for accessing gate 102 is not shown, although it is also formed simultaneously with contact plug 107. Contact plug 107 may be formed of tungsten (W), although other conductive materials such as silver, aluminum (Al), copper (Cu), AlCu, and the like may also be used or added. Middle ILD 112 over the bottom ILD 111 surrounds the heater 130 or the bottom electrode and the phase change layer 140. In the peripheral region 121 of FIG. 1, the contact plug 107' accessing source 103 or drain 105 and the contact plug 108' accessing the gate 102 penetrates through the bottom ILD 111 and the middle ILD 112.

The phase change layer 140 includes commonly used chalcogenide materials including, but not limited to, one or more of Ge, Te, and Sb, e.g., which may be GeSbTe, NGeSbTe, InGeSbTe, or stoichiometric materials thereof.

In FIG. 1, the heater includes a heat isolation shell 130A composed of a first material and a heat conducting core 130B composed of a second material and surrounded by the heat isolation shell 130A. In some embodiments, a first thermal conductivity of the first material is smaller than a second thermal conductivity of the second material. For example, the first material may include TaN, which has a first thermal conductivity of 3 W/mK, while the second material may include TiN, which has a thermal conductivity of 20 W/mK. For another example, the first material may include TaN, which has a thermal conductivity of 3 W/mK, while the second material may include Ta, which has a thermal conductivity of 57 W/mK. It is shown that the heater 130 has a first surface 130C in contact with the phase change layer 140 and a second surface 130D opposite to the first surface 130C.

In some embodiments, the heat isolation shell 130A encloses a sidewall and a bottom of the heat conducting core 130B, and therefore the first material and the second material are both exposed from the first surface 130C. In other words, the heat conducting core 130B and the heat isolation shell 130A are both in contact with a bottom surface of the phase change layer 140 at the first surface 130C. It is shown that the entire heat conducting core 130B is in contact with the phase change layer 140 while only a portion of the heat isolation shell 130A is in contact with the phase change layer 140. However, the illustration of FIG. 1 is not intended to be limiting regarding the interface between the phase change layer 140 and the heat conducting core 130B as well as the heat isolation shell 130A of the heater 130. Other arrangements, such as only the heat conducting core 130B is in contact with the bottom of the phase change layer 140, shall be enclosed in the contemplated scope of present disclosure. On the other hand, as shown in FIG. 1, only the first material is exposed at the second surface 130D connecting to the contact plug 107 and the bottom ILD 111.

In some other embodiments, the heat isolation shell 130A is in contact with only a sidewall of the heat conducting core 130B, and therefore the first material and the second material are both exposed from the first surface 130C. In other words, the heat conducting core 130B and the heat isolation shell 130A are both in contact with the phase change layer 140 at the first surface. On the other hand, the first material and the second material are both exposed from the second surface 130D under the scheme that only a sidewall of the heat conducting core 130B is surrounded by the heat isolation shell 130A.

In still some other embodiments, the heat isolation shell 130A is in contact with only a bottom of the heat conducting core 130B, and therefore only the first material is exposed from the first surface 130C. In other words, only the heat conducting core 130B is in contact with the phase change layer 140 at the first surface. On the other hand, only the first material is exposed from the second surface 130D under the scheme that heat isolation shell 130A is in contact with only a bottom of the heat conducting core 130B.

In the amorphous phase, the phase change layer 140, e.g., of GST, has short-range atomic order and low free electron density, which results in higher resistivity. This is sometimes referred to as the RESET phase, because it is usually formed after a RESET operation, in which the temperature of the phase change layer 140 is raised, through a reset current applied on the heater 130, slightly above the melting point, then the phase change layer 140 is suddenly quenched to cool it. The rate of cooling is critical for the formation of the amorphous phase. The typical resistance of the amorphous phase of GST can exceed one mega-ohm.

In the crystalline phase, the GST material of the phase change layer 140 has long-range atomic order and high free electronic density, which results in lower resistivity. This is also known as the SET phase because it is formed after a SET operation, in which the temperature of the material is raised above the re-crystallization temperature but below the melting point, then cooled slightly slower to allow crystalline grains to form throughout the phase change layer 140. The typical resistance of the crystalline phase of GST ranges from 1 to 10 kilo-ohms, which is remarkably lower than that of the amorphous phase.

The voltage and/or current values of the RESET and SET pulses are selected to produce melting or re-crystallization of the phase change material. RESET pulses should raise the temperature just above the melting point and then allow the material to cool rapidly to the amorphous phase. SET pulses should raise the temperature just above the re-crystallization temperature but below the melting point, and allow a longer time to cool it.

An R-I (resistance-current) curve is a parameter of the phase change layer 140, which indicates a change of resistance value in response to various current values used in the RESET or SET pulses. The R-I curve may be determined for the RESET operation or for the SET operation separately. The R-I curve can be measured using various approaches. For example, an R-load measurement technique may be used, which couples a load resistor with the phase change layer 140. Some other techniques eliminate the need for the load resistor and the related snapback side effects.

Figure 2:
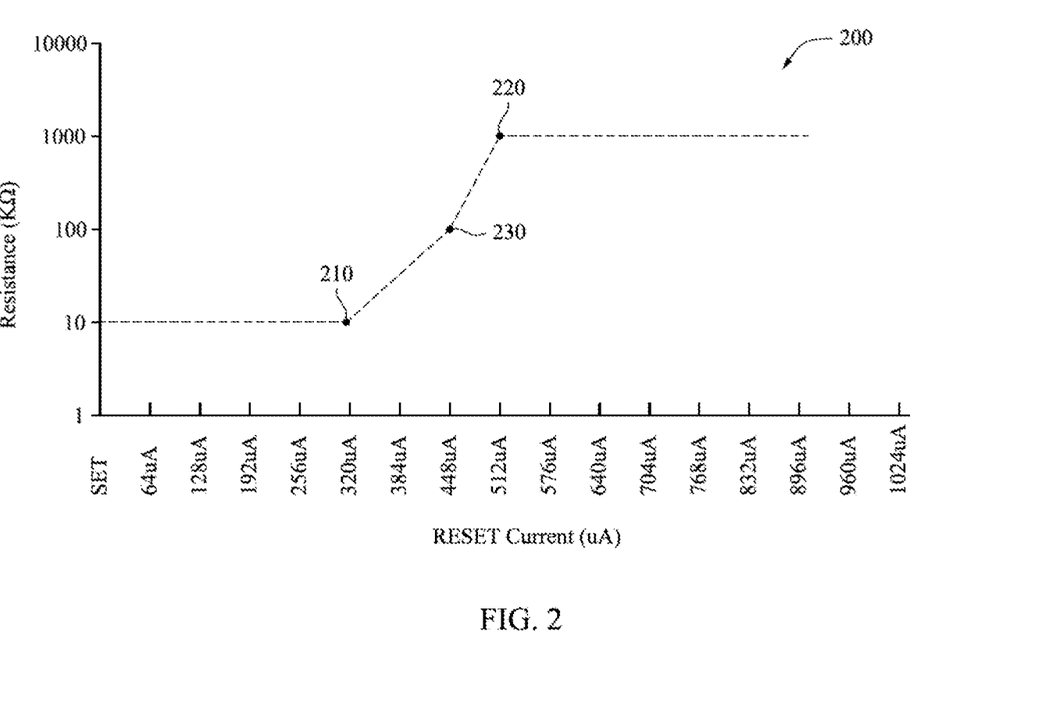
FIG. 2 illustrates an example I-R curve.

FIG. 2 shows an example R-I curve 200 under a RESET operation on an example phase change layer 140. As shown in FIG. 2, the example phase change layer 140 requires a RESET current of about 320 µA to have the resistance value start increasing at the RESET starting point 210, and requires a RESET current of about 512 µA to reach the high resistance phase, e.g., the full RESET phase (at about 1000 kΩ) at the RESET point 220. In some embodiment, a partial RESET point 230, e.g., where the resistance value reaches 100 kΩ, may also be used to characterize the example R-I curve.

A PCRAM device or a wafer of PCRAM cells include a large amount of PCM memory cells each including a phase change layer 140. The PCM cells have inherent variations in the phase change properties including the R-I curves of the phase change layers 140. The inherent cell variations in the R-I curves are difficult to control by material fabrication or device fabrication.

In conceiving and reducing into practice the current techniques, the inventor has recognized that the R-I curves or other programming curves of phase change layers 140 can be modulated through stressing. For example, constant stress or cycling stress enhances material segregation and modulates the programing curves of the phase change layers 140 by shifting the programing curves. Patterns of the R-I curve shifting under stress also vary among phase change layers 140.

Figure 3:
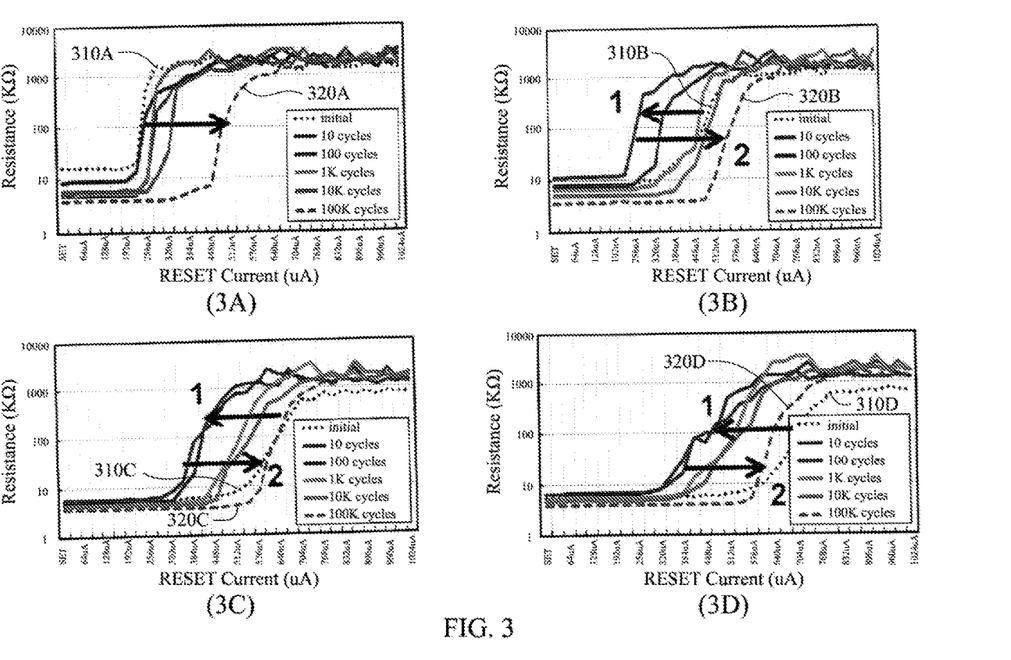
FIG. 3 illustrates example I-R curve shift patterns under stressing according to embodiments of the disclosure.

FIG. 3 shows four example patterns of R-I curve shift under the different amount of current stress cycles. Each cycle includes a RESET current pulse and a SET current pulse. In some embodiments, the RESET current value is in a range of about 100 uA to about 1 mA, the RESET pulse width is in a range of about 100 ns to about 1 us. The SET current value is in a range of about 100 uA to 1 mA, and the SET pulse width is in a range of about 1 us to about 10 us. Generally, a larger current value can speed up the shift behavior. As shown in FIG. 3A, in a first pattern, an initial position 310A of the R-I curve ("initial R-I curve") of a phase change layer 140 is already positioned to the left with respect to other initial R-I curves 310B, 310C, 310D, which indicates that a lower RESET current is required to change the phase of the phase change layer 140 from the SET phase to the RESET phase. Upon various amounts of stress cycles being applied, for example, 10 cycles, 100 cycles, 1 K cycles, 10 K cycles and 100 K cycles, the R-I curve consistently moves to the right side, e.g., which indicates that a larger RESET current is required to change the phase. After 100 K cycles of current stress pulses have been applied, the R-I curve eventually shifts to the right side at position 320A, which is further right than the R-I curves under the 10 cycles, 100 cycles, 1 K cycles, 10 K cycles of current stress.

As shown in FIG. 3B, in a second pattern, when various cycles of current stress are applied, for example, 10 cycles, 100 cycles, 1 K cycles, 10 K cycles and 100 K cycles, the R-I curve is modulated to shift from the initial position 310B first to the left side (indicating that a lower RESET program current is required to program RESET), after 10 cycles to 100 cycles of current stress, then back to the about the initial position 310B, after 1 K cycles to 10 K cycles of current stress, and eventually to the right side of the initial position 310B after 100 K cycles of current stress have been applied to reach a position 320B.

As shown in FIG. 3C, in a third pattern, when various cycles of current stress are applied, for example, 10 cycles, 100 cycles, 1 K cycles, 10 K cycles and 100 K cycles, the R-I curve is modulated to shift from the initial position 310C first to the left side (indicating that a lower RESET program current is required to program RESET), after 10 cycles to 100 cycles of current stress, then to the right toward the initial position 310B, after 1 K cycles to 10 K cycles of current stress, and eventually back to about the initial position 310B after 100 K cycles of current stress have been applied to reach a position 320C.

As shown in FIG. 3D, in a fourth pattern, when various cycles of current stress are applied, for example, 10 cycles, 100 cycles, 1 K cycles, 10 K cycles and 100 K cycles, the R-I curve is modulated to shift from the initial position 310D first to the left side (indicating that a lower RESET program current is required to program RESET), after 10 cycles to 100 cycles of current stress, then to the right toward the initial position 310B, after 1 K cycles to 10 K cycles of current stress, and eventually reach a position 320D which is still left to the initial position 310B after 100 K cycles of current stress have been applied.

As shown in the patterns of FIGS. 3A-3D, the R-I curves of the phase change layers 140 predominantly tend to shift to the right from the initial positions 310A, 310B, 310C after about 100 K cycles of current stress, except for the case of 310D. Before 100 K cycles of current stress, the dominant pattern is that the R-I curves shift to the left from the initial positions. The patterns also show that in a certain range of stress cycles ("stable range of stress"), e.g., between about 1 K and about 10 K cycles of current stress in the example data shown in FIG. 3, the R-I curves are relatively stable, e.g., do not shift with an application of a RESET current, and are relatively uniform among all the phase change layers 140, which is referred to as a "stable range of R-I curves." The stable range of R-I curves can be obtained through experimental data or through simulation for different phase change materials. The patterns also show that after certain stress cycles, for example, after 10 K stress cycles, the R-I curves under stress modulation predominantly show right-shift tendency as compared to the R-I curves modulated with less than 10 K stress cycles.

Based on the experimental data of the R-I curve shift patterns, a target R-I curve position can be determined for modulating or trimming all phase change layers 140 of the PCRAM device 10 or a wafer containing integrated circuit chips each for forming a PCRAM device 10.

Figure 4:
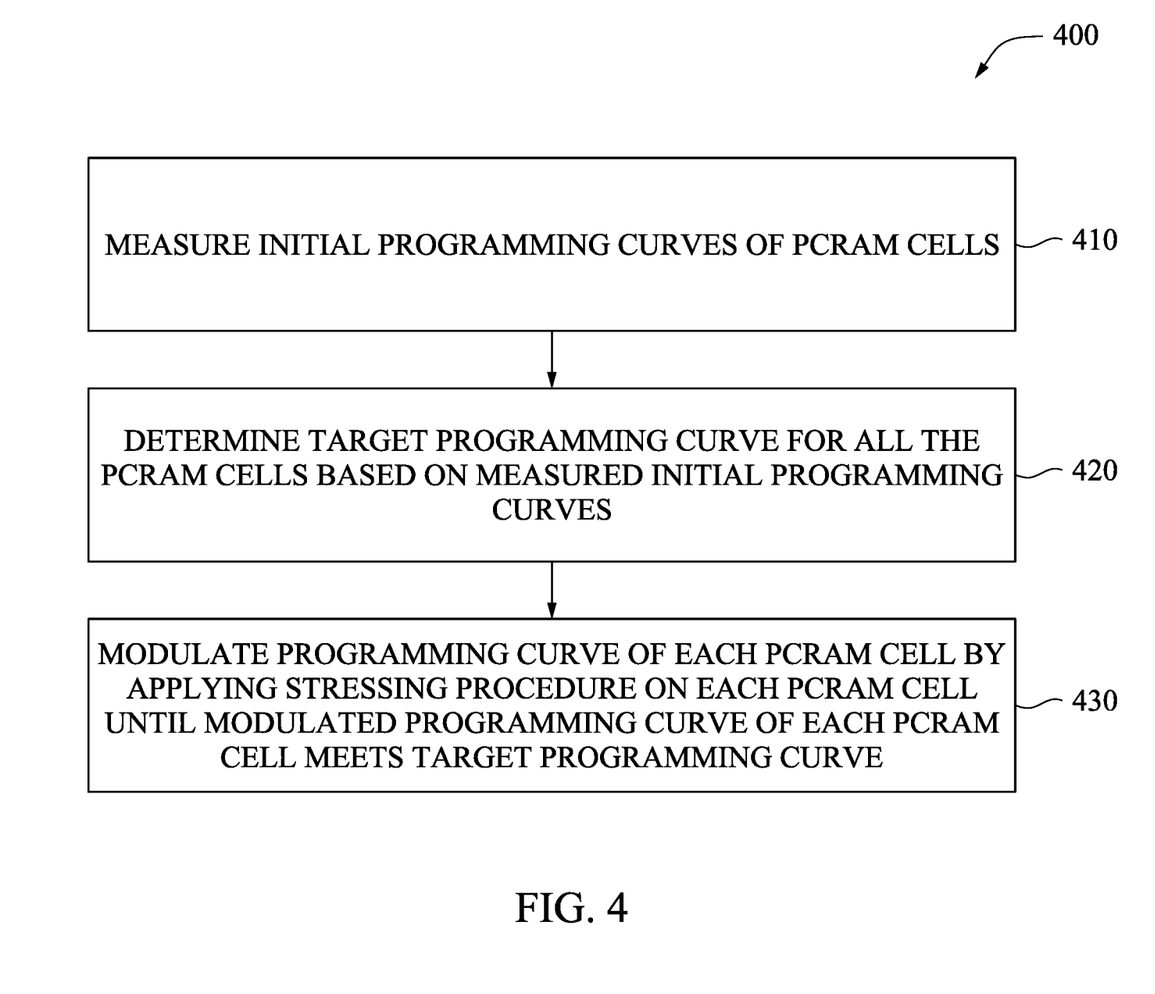
FIG. 4 illustrates an example process of modulating programming curves of PCRAM cells according to embodiments of the disclosure.

FIG. 4 shows an example process 400 of modulating programming curves of PCRAM cells. Referring to FIG. 4, in example operation 410, initial programming curves of PCRAM cells are measured. The measurement of the programming curves may be achieved through any suitable approaches, which are all included in the disclosure.

In example operation 420, a target programming curve is determined for all the PCRAM cells based on the measured initial programming curves. For example, in the case of R-I curve, the target R-I curve may be set at a position to the right of all or most, e.g., 90%, of the initial R-I curves of the PCRAM cells. For another example, the target R-I curve may be set within a stable range of the R-I curves. For example, in the example R-I curves of FIG. 3, the modulated R-I curves of FIGS. 3A-3D have similar positions in the stable range after about 1K to about 10 K of stress cycles. The target R-I curve may be determined based on a position of the R-I curve after an amount of stress cycles within the range of 1 K to 10 K cycles of current stress. It is assumed based on experimental data, e.g., the data of FIG. 3, or other approaches, e.g., simulation, that the R-I curve of each PCRAM cell will eventually reach the target R-I curve with various stress cycles being applied. In still another example, the target R-I curve is set at position to the left of the initial R-I curves of most, e.g., 85%, of the PCRAM cells because it is assumed that within 10 K cycles of current stress, the left-shifting is a predominant modulation pattern for most of the phase change layers 140.

In example operation 430, a stressing procedure is applied to each PCRAM cell to modulate the programming curve of the phase change layer 140 of the PCRAM cell to reach the target programming curve. The stressing procedure may include constant current stress, constant stress voltage, cycling current stress pulses, cycling stress voltage pulses, or other suitable stressing approaches. In an embodiment, cycles of current stress are used for each PCRAM cell. A cycle of current stress includes a RESET current pulse and a SET current pulse. During the stressing procedure applied to each PCRAM cell, the programming curve of the phase change layer 140 may be dynamically and/or periodically measured to determine whether the target programming curve has been reached or met.

In an embodiment, a threshold or tolerance range is used to determine whether the modulated programming curve reaches or meets the target programming curve. The threshold or tolerance range may be set as between about −2% to about +2% around the target programming curve. For example, for the example RESET I-R curve of FIG. 2, the threshold or tolerance range may be determined based on one or more of the RESET starting point, the partial RESET point or the RESET point of the RESET I-R curve. Other approaches to define the threshold or tolerance range are also possible and included in the disclosure.

Figure 5:
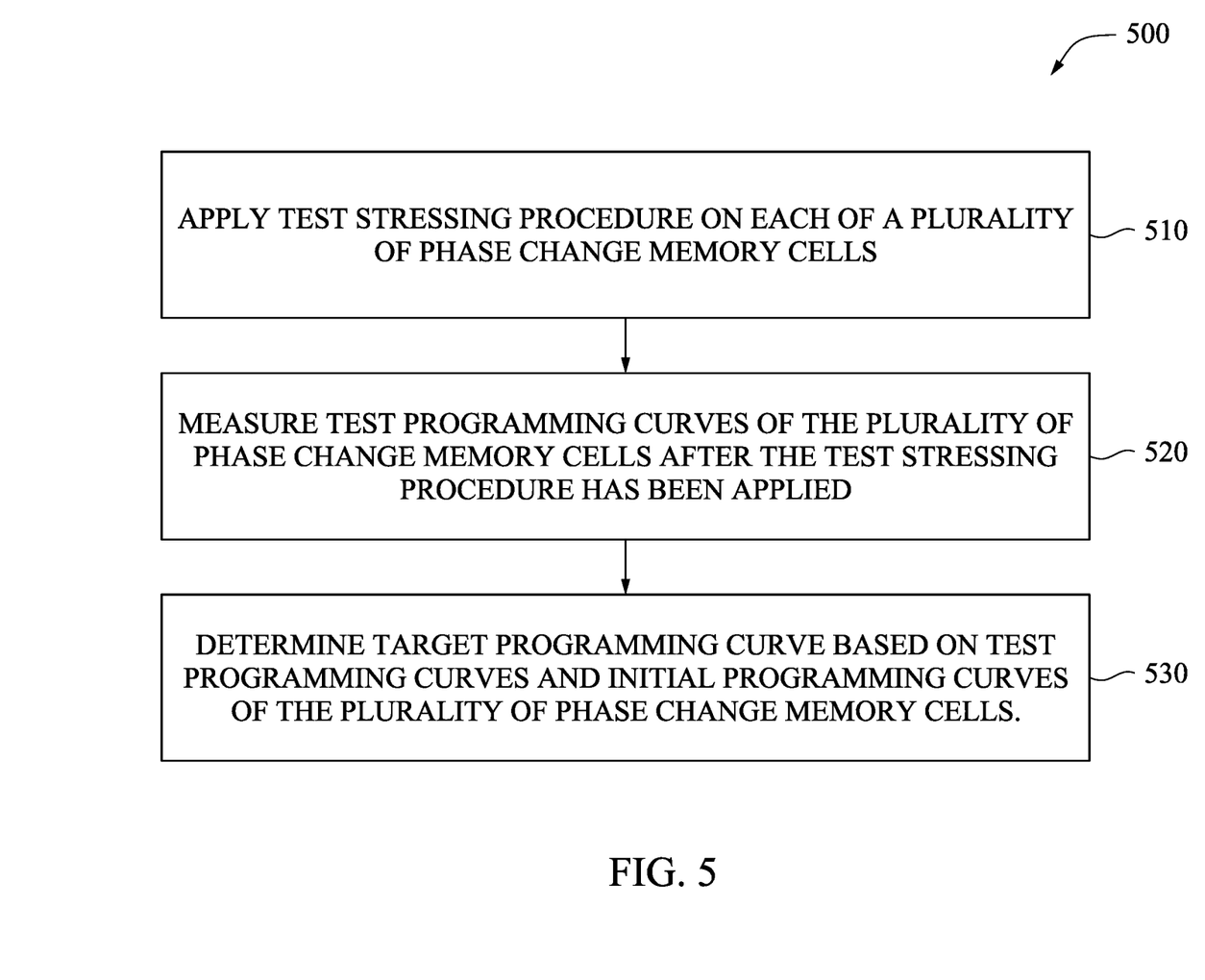
FIG. 5 illustrates an example process of determining a target programming curve according to embodiments of the disclosure.

FIG. 5 shows an example process 500 of determining a target programming curve. In example operation 510, a test stressing procedure is applied to each PCRAM cell. A same test stressing procedure is used for all the PCRAM cells to determine an initial direction of the programming curve shift in reaction to the test stressing procedure for each PCRAM cell. For example, in a case of R-I curve, the test stressing procedure may be a same amount of cycling current pulses in a range between about 100 cycles of current stress and about 10 k cycles of current stress.

In some embodiments, a first threshold amount of stressing may be determined for a phase change material, e.g., GST, beyond which all phase change layers 140 of the phase change material exhibit a same direction of shifting in R-I curve modulation. For example, for GST, experimental data (e.g., FIG. 3) indicates that after about 10 K to 100 k cycles of current stress, all GST layers 140 exhibit shift-right properties. The test stressing procedure includes a stressing amount which is smaller than the first threshold amount. Therefore, under the test stressing procedure, phase change layers 140 exhibit different initial shifting direction and different shifting patterns.

In example operation 520, after the test stressing procedure is applied, a test R-I curve is measured for each PCRAM cell having a phase change layer 140. The test R-I curve indicates the R-I curve shifting pattern of the PCRAM cell under stressing. Using the R-I shifting patterns of FIG. 3 as illustrative examples, after 100 cycles of test stressing, the R-I curves of PCRAMs may either shift to the left, e.g., FIGS. 3B, 3C, 3D or shift to the right, FIG. 3A.

Figure 6:
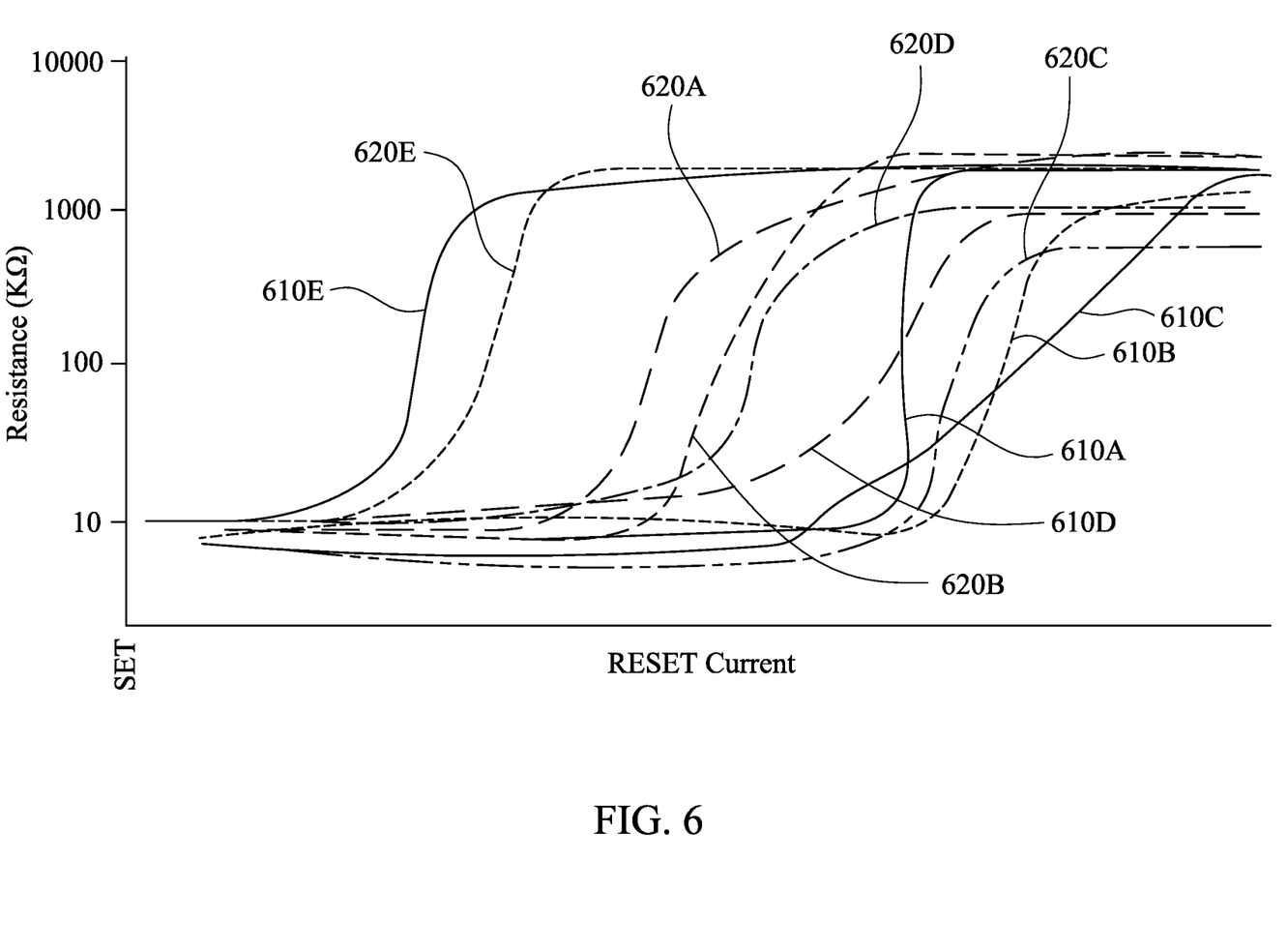
FIG. 6 illustrates an example initial I-R curve and test I-R curves according to embodiments of the disclosure.

FIG. 6 shows, as an illustrative example, initial R-I curves 610A, 610B, 610C, 610D, 610E of five PCRAM cells, and the respective test R-I curves 620A, 620B, 620C, 620D, 620E. As shown in FIG. 6, test R-I curves 620A, 620B, 620C, 620D shift to the left from the respective initial R-I curves 610A, 610B, 610C, 610D. Test R-I curve 620E shifts to the right from the initial R-I curve 610E. In some embodiments, among all the test R-I curves, a right border test R-I curve is determined, which is the right-most one among all the test R-I curves. Here test R-I curve 620C is the right border test R-I curve.

In example operation 530, a target R-I curve is determined based on the initial R-I curves and the test R-I curves of the PCRAM cells. In some embodiments, the target R-I curve is set to be at the right side to all the test R-I curves. For example, the target R-I curve is set at the right side to the right boarder test R-I curve. In some embodiments, the target R-I curve is set at the left side to a middle I-R curve of or among all the initial I-R curves. The middle I-R curve may be determined as an average initial R-I curve or a median initial R-I curve among all the initial R-I curves. Within the amount of stressing of the test stressing procedure, the predominant R-I curve shifting pattern is left-shift from the initial R-I curve. So generally, the average or median initial R-I curve is positioned at the right side of the right border test R-I curve. Based on the R-I curve shifting patterns of FIG. 3, with further test cycles being applied on the PCRAM cells after the test stressing procedure, the R-I curves of all the PCRAM cells will shift toward the target R-I curve.

The descriptions herein use R-I curve as an example programming curve of a phase change layer of a PCRAM cell. The disclosure can be similarly applied to other programming curves like I-V (current-voltage) curves. The descriptions herein use RESET I-R curves as example of I-R curves. They can be similarly applied to SET I-R curves.

Using the disclosed techniques, a target programming curve can be set based on the initial programming curve shift directions or the programming curve shift patterns of the PCRAM cells. As such, the target programming curve can be positioned to the left of the initial programming curve of some of the PCRAM cells and to the right of the initial programming curve of some other PCRAM cells. The overall stressing amount can be reduced and the endurance of the PCRAM cells can be maintained at a relatively higher level.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments.

In some embodiments, a method includes: determining initial programming curves of a plurality of phase change memory cells; determining a same target programming curve for the plurality of phase change memory cells based on the initial programming curves; and modulating a first phase change memory cell of the plurality of phase change memory cells by applying a first stressing procedure on the first phase change memory cell until a modulated programming curve of the first phase change memory cell meets the target programming curve.

In some embodiments, a method includes: determining initial programming curves of a plurality of phase change memory cells; determining shift patterns of the initial programming curves of the plurality of phase change memory cells by applying a test stress procedure to the plurality of phase change memory cells; determining a target programming curve for the plurality of phase change memory cells based on the shift patterns of the plurality of phase change memory cells; and modulating a programming curve of each phase change memory cell of the plurality of phase change memory cells through stressing until a modulated programming curve of each phase change memory cell meets the target programming curve. To be completed after inventor review.

In some embodiments, a method includes: determining initial resistance-current curves of a plurality of phase change layers; determining a target resistance-current curve for the plurality of phase change layers based on the initial resistance-current curves; and applying cycles of RESET current pulses and SET current pulses on each phase change layer until a modulated resistance-current curve of the phase change layer meets the target resistance-current curve.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
   determining initial resistance-current curves of a plurality of phase change memory cells;
   determining a target resistance-current curve for the plurality of phase change memory cells based on the initial resistance-current curves; and
   modulating a first phase change memory cell of the plurality of phase change memory cells based on the target resistance-current curve,
   wherein the determining the target resistance-current curve includes:
      applying a test stressing procedure on each of the plurality of phase change memory cells;
      measuring test resistance-current curves of the plurality of phase change memory cells after the test stressing procedure has been applied; and
      determining a resistance-current curve that requires a higher reset current than all the test resistance-current curves as the target resistance-current curve.

2. The method of claim 1, wherein the modulating the first phase change memory cell of the plurality of phase change memory cells includes applying a first stressing procedure on the first phase change memory cell until a modulated resistance-current curve of the first phase change memory cell meets the target resistance-current curve, the first stressing procedure including applying a first number of cycles of current stress pulses on the first phase change memory cell.

3. The method of claim 2, wherein the cycles of current stress pulses each includes a RESET current pulse and a SET current pulse.

4. The method of claim 1, wherein the test stressing procedure is configured to determine initial shift directions from the initial resistance-current curves of the plurality of phase change memory cells.

5. The method of claim 4, wherein the initial shift directions of the initial resistance-current curves of the plurality of phase change memory cells include a right-shift direction and a left-shift direction.

6. The method of claim 1, wherein the determining the target resistance-current curve includes determining a resistance-current curve that requires a lower reset current than a middle resistance-current curve of the initial resistance-current curves.

7. The method of claim 6, wherein the middle resistance-current curve is a median among all the initial resistance-current curves.

8. The method of claim 6, wherein the middle resistance-current curve is an average among all the initial resistance-current curves.

9. A method, comprising:
determining initial programming curves of a plurality of phase change memory cells;
determining a target programming curve for the plurality of phase change memory cells based on the initial programming curves; and
modulating a first phase change memory cell of the plurality of phase change memory cells based on the target programming curve,
wherein the determining the target programming curve includes:
applying a test stressing procedure on each of the plurality of phase change memory cells;
measuring test programming curves of the plurality of phase change memory cells after the test stressing procedure has been applied; and
determining the target programming curve based on the test programming curves and the initial programming curves of the plurality of phase change memory cells; and
wherein the test stressing procedure is configured to determine initial shift directions from the initial programming curves of the plurality of phase change memory cells, the initial shift directions of the initial programming curves of the plurality of phase change memory cells including a right-shift direction and a left-shift direction.

10. The method of claim 9, wherein the modulating the first phase change memory cell of the plurality of phase change memory cells includes applying a first stressing procedure on the first phase change memory cell until a modulated resistance-current curve of the first phase change memory cell meets the target programming curve, the first stressing procedure including applying a first number of cycles of current stress pulses on the first phase change memory cell.

11. The method of claim 10, wherein the cycles of current stress pulses each includes a RESET current pulse and a SET current pulse.

12. The method of claim 10, wherein a threshold range is used to determine that the modulated programming curve of the first phase change memory cell meets the target programming curve.

13. A method, comprising:
determining initial programming curves of a plurality of phase change memory cells;
determining shift patterns of the initial programming curves of the plurality of phase change memory cells by applying a test stress procedure to the plurality of phase change memory cells;
determining a target programming curve for the plurality of phase change memory cells based on the shift patterns of the plurality of phase change memory cells; and
modulating a programming curve of each phase change memory cell of the plurality of phase change memory cells based on the target programming curve,
wherein the modulating the programming curve includes dynamically and periodically measuring the programming curve.

14. The method of claim 13, wherein the determining the shift patterns includes determining test programming curves of the plurality of phase change memory cells after the test stress procedure has been applied.

15. The method of claim 13, wherein the modulating the programming curve includes applying a threshold range to determine that the modulated programming curve of each phase change memory cell meets the target programming curve.

16. The method of claim 13, wherein the initial programming curves and the target programming curve are resistance-current curves, and the stressing includes applying cycles of RESET current pulses and SET current pulses on a phase change layer of each phase change memory cell until a modulated resistance-current curve of the phase change layer meets the target programming curve.

17. The method of claim 16, wherein the target resistance-current curve is positioned within a stable range of resistance-current curves of phase change layers of the plurality of phase change memory cells, within which the resistance-current curves do not shift with application of a reset current.

18. The method of claim 17, wherein the stable range of the resistance-current curves of the phase change layers is determined based on experimental data.

19. The method of claim 17, wherein the stable range of the resistance-current curves of the phase change layers is determined using simulation.

20. The method of claim 13, wherein the modulating the programming curve of each phase change memory cell of the plurality of phase change memory cells includes modulating the programming curve of each phase change memory cell through stressing.

* * * * *